US006997722B2

(12) United States Patent
Mangold (10) Patent No.: US 6,997,722 B2
(45) Date of Patent: Feb. 14, 2006

(54) ESD SYSTEM FOR GROUNDING ELECTRONICS WITHIN AN ENCLOSURE

(75) Inventor: Urs Mangold, Fremont, CA (US)

(73) Assignee: Elma Electronic Inc., Fremont, CA (US)

( * ) Notice: Subject to any disclaimer, the term of this patent is extended or adjusted under 35 U.S.C. 154(b) by 0 days.

(21) Appl. No.: 10/808,123

(22) Filed: Mar. 24, 2004

(65) Prior Publication Data

US 2004/0266232 A1 Dec. 30, 2004

Related U.S. Application Data (60) Provisional application No. 60/457,737, filed on Mar. 25, 2003.

(51) Int. Cl.
*H01R 4/66* (2006.01)
(52) U.S. Cl. .............. 439/92; 439/95; 174/35 GC; 174/35 R; 174/51; 361/816; 361/818; 361/800; 361/801
(58) Field of Classification Search .......... 439/92, 439/95, 181; 174/35 GC, 35 R, 51, 35 C; 361/816, 818, 800, 801
See application file for complete search history.

(56) References Cited

U.S. PATENT DOCUMENTS

| 3,835,438 | A | * | 9/1974 | Longworth, Jr. ............ 439/97 |
| 4,781,603 | A | * | 11/1988 | Olsson et al. .............. 439/95 |
| 5,196,712 | A | * | 3/1993 | Nguyen et al. ............ 250/551 |
| 5,311,408 | A | * | 5/1994 | Ferchau et al. ............ 361/818 |
| 5,317,105 | A | * | 5/1994 | Weber .................... 174/35 GC |
| 5,478,253 | A | * | 12/1995 | Biechler et al. ............ 439/181 |
| 5,537,294 | A | * | 7/1996 | Siwinski ................... 361/753 |
| 5,867,366 | A | * | 2/1999 | Klein et al. ............... 361/737 |
| 5,916,652 | A | * | 6/1999 | Miner et al. .............. 428/41.8 |
| 5,943,219 | A | * | 8/1999 | Bellino et al. ............ 361/816 |
| 5,973,926 | A | * | 10/1999 | Sacherman et al. ........ 361/759 |
| 5,975,953 | A | * | 11/1999 | Peterson .................. 439/607 |
| 6,078,504 | A | * | 6/2000 | Miles ..................... 361/727 |
| 6,080,930 | A | * | 6/2000 | Lommen et al. ....... 174/35 GC |
| 6,159,024 | A | * | 12/2000 | Munch et al. ............... 439/92 |
| 6,201,710 | B1 | * | 3/2001 | Bagung et al. ............ 361/799 |
| 6,254,402 | B1 | * | 7/2001 | Barnes et al. .............. 439/95 |
| 6,271,465 | B1 | * | 8/2001 | Lacey ..................... 174/35 R |
| 6,276,947 | B1 | * | 8/2001 | Homfeldt et al. ........... 439/92 |
| 6,282,101 | B1 | * | 8/2001 | Hanas et al. .............. 361/818 |
| 6,301,124 | B1 | * | 10/2001 | Nikazm et al. ............ 361/799 |
| 6,483,023 | B1 | * | 11/2002 | Jacques ................. 174/35 GC |
| 6,508,653 | B1 | * | 1/2003 | Malone et al. .............. 439/92 |
| 6,590,153 | B1 | * | 7/2003 | Kohan .................... 174/35 C |
| 6,686,535 | B1 | * | 2/2004 | Evans .................. 174/35 GC |
| 6,700,799 | B1 | * | 3/2004 | Sandoval et al. .......... 361/818 |
| 6,780,030 | B1 | * | 8/2004 | Yoshinaga et al. .......... 439/92 |
| 6,816,383 | B1 | * | 11/2004 | Barringer et al. .......... 361/759 |

* cited by examiner

*Primary Examiner*—Gary Paumen
(74) *Attorney, Agent, or Firm*—Vierra Magen Marcus Harmon & DeNiro LLP (57) ABSTRACT

A system for dissipating static electric charge from electronics on a circuit board as the board is inserted into the enclosure, the system comprising one or more elastic, deformable and electrically conductive gaskets mounted within the enclosure for engaging ground pins on the circuit board.

39 Claims, 6 Drawing Sheets

ESD SYSTEM FOR GROUNDING ELECTRONICS WITHIN AN ENCLOSURE

CROSS REFERENCE TO RELATED APPLICATION

The present application claims the benefit under 35 U.S.C. §119(e) of U.S. Provisional Patent Application Ser. No. 60/457,737, filed Mar. 25, 2003.

BACKGROUND OF THE INVENTION

1. Field of the Invention

This invention relates generally to the field of enclosures for housing electronics, and in particular to a system for dissipating static electric charge from electronics on a circuit board as the board is inserted into the enclosure.

2. Description of the Related Art

Enclosures for housing electronic circuit boards are widely used in a variety of technologies, including telecommunications, industrial control, medical electronics, and military applications. Such enclosures are provided with guides so that individual circuit boards can be slid in or out of the enclosure, and a backplane through which the circuit boards may be electrically connected to other electronic components. Each circuit board is electronically connected to the backplane through engagement of pins projecting from the backplane with connectors attached to the circuit boards.

When a circuit board is inserted in an enclosure, static from the technician may be discharged onto the circuit board. It is important that this static be discharged from the circuit board prior to the connectors of the circuit board making contact with the pins of the backplane. Otherwise, the static will travel through the backplane pins toward electronic components connected to those pins and may damage those components.

In electronics systems, many devices and techniques have been developed to provide electrostatic discharge (ESD) protection and to provide electromagnetic containment (EMC) or electromagnetic interference (EMI) shielding. These devices and techniques include those disclosed in the following references, each of which is incorporated by reference it its entirety herein:

U.S. Pat. No. 3,835,438, issued Sep. 10, 1974 to Longworth, Jr., entitled "Self-Grounding Clip For The Mounting Strap Of An Electric Switch Or Receptacle";

U.S. Pat. No. 4,781,603, issued Nov. 1, 1988 to Olsson et al., entitled "Grounding System For A Cabinet";

U.S. Pat. No. 5,196,712, issued Mar. 23, 1993 to Nguyen et al., entitled "Printed Circuit Board Apparatus With Optical Switching";

U.S. Pat. No. 5,311,408, issued May 10, 1994 to Ferchau et al., entitled "Electronic Assembly With Improved Grounding And EMI Shielding";

U.S. Pat. No. 5,478,253, issued Dec. 26, 1995 to Biechler et al., entitled "Electrostatic Discharge Contacts For Blind Mating Connectors";

U.S. Pat. No. 5,537,294, issued Jul. 16, 1996 to Siwinski, entitled "Printed Circuit Card Having A Contact Clip For Grounding A Printed Circuit Board Found Therein";

U.S. Pat. No. 5,867,366, issued Feb. 2, 1999 to Klein et al., entitled "Electronic Module And Plastic Substrate To Accept And Hold The Electronic Module";

U.S. Pat. No. 5,916,652, issued Jun. 29, 1999 to Miner et al., entitled "Liner For Adhesive-Backed Sheet Material";

U.S. Pat. No. 5,934,916, issued Aug. 10, 1999 to Latal et al., entitled "Printed Circuit Board Mounting Rail Member And Ground Clip Assembly";

U.S. Pat. No. 5,973,926, issued Oct. 26, 1999 to Sacherman et al., entitled "Method And Apparatus For Attaching Circuit Board To Chassis And Forming Solid Ground Connection Using A Single Crew";

U.S. Pat. No. 6,080,930, issued Jun. 27, 2000 to Lommen et al., entitled "ESD/EMC Gasket";

U.S. Pat. No. 6,159,024, issued Dec. 12, 2000 to Munch et al., entitled "Device For Creating An Electrically Conducting Connection For An Assembly Panel Fitted In A Switch Cabinet";

U.S. Pat. No. 6,201,710, issued Mar. 13, 2001 to Bagung et al., entitled "Housing Configuration For A Printed Circuit Board Equipped With Components";

U.S. Pat. No. 6,254,402, issued Jul. 3, 2001 to Barnes, Jr. et al., entitled "Push Pin Ground";

U.S. Pat. No. 6,276,947, issued Aug. 21, 2001 to Homfeldt et al., entitled "U-Crimp";

U.S. Pat. No. 6,282,101, issued Aug. 28, 2001 to Hanas et al., entitled "EMI/ESD Shielding Assembly For An Electronic System";

U.S. Pat. No. 6,301,124, issued Oct. 9, 2001 to Nikazm et al., entitled "Computer Chassis Identification Method"; and U.S. Pat. No. 6,483,023, issued Nov. 19, 2002 to Jacques, entitled "Fabric Wrapped Over Spring EMI Gasket".

Figure 6:
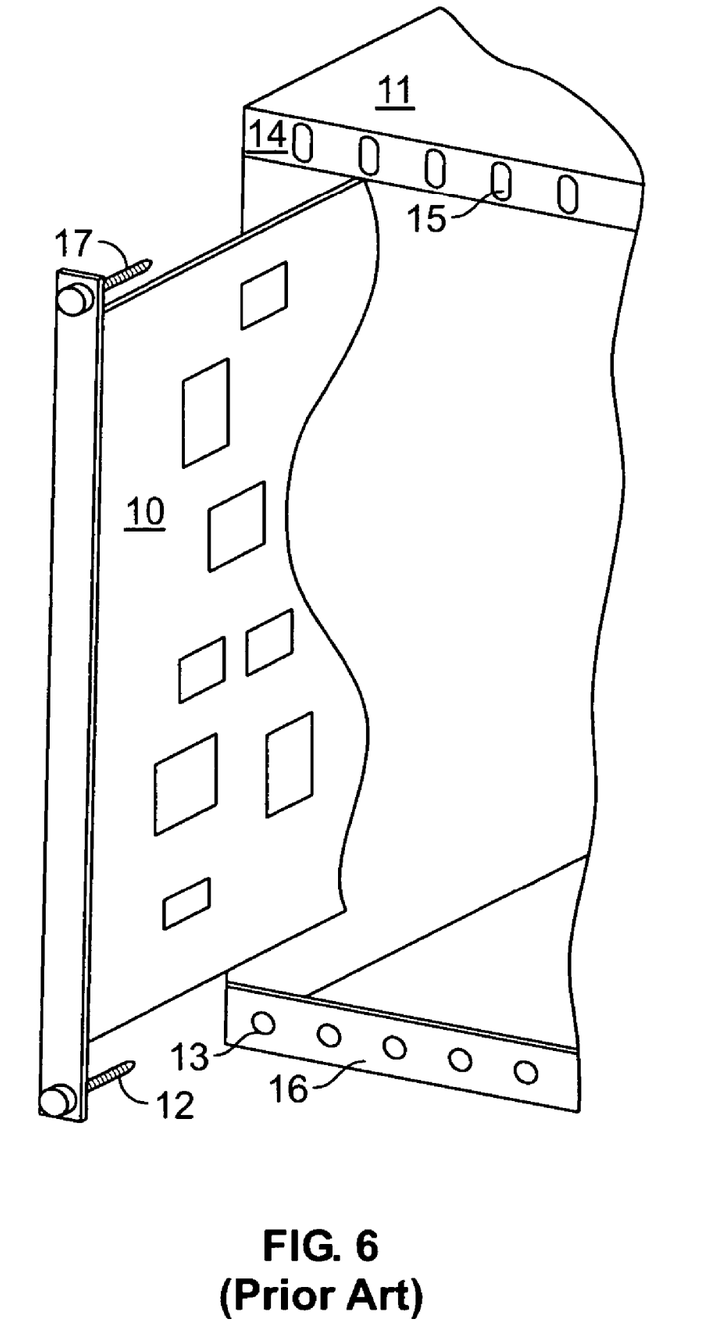
FIG. 6 is a prior art partial perspective view of a conventional electronics enclosure and printed circuit board fitting therein and having a ground pin and an alignment pin.

Referring first to FIG. 6, which is a prior art representation of a portion of a printed circuit board 10 being inserted into a conventional enclosure 11. The circuit board 10 may conventionally include ground pins 12 beneath the printed circuit board which fit into receptacles 13 formed through a bottom bracket 16 across the front face of the enclosure. Typically, the bottom receptacles are circular openings sized so that the ground pin 12 at the bottom of the printed circuit board engages the sides of the receptacles 13 prior to the circuit board connectors engaging the backplane pins so that any charge on the circuit boards passes from the pins to the brackets as a result of contact with the sides of the receptacles. The brackets are in turn grounded through the housing of the enclosure.

A problem of the above solution is that the pins must be aligned to the receptacles within a relatively tight tolerance. If the pins do not align properly within the receptacles (for example due to faulty manufacturing or a ground pin being bent), the pins may butt up against the bracket and prevent the circuit board from being inserted into the enclosure. This problem is exacerbated in that typical enclosures may have slots for sixteen or more circuit boards, each having a separate ground pin which must align and be properly received within its respective receptacle. Other conventional enclosures house even more circuit boards.

Even where the pins do fit within the receptacles, there is not always good electrical contact, resulting either in charge being retained on the boards, or charge having to travel across a relatively small contact area between pin and receptacle, thus resulting in high resistances and heat generation.

Referring still to prior art FIG. 6, the enclosure typically includes a second receptacle 15 mounted in a top bracket 14 for receiving an alignment pin 17 on the top portion of the circuit board 10. Owing to the difficulty in aligning both bottom pin 12 and top pin 17 within respective bottom and top receptacles 13 and 15, the top receptacle 15 is typically oblong in shape. (The positions of circular receptacle 13 and oblong receptacle 15 are occasionally switched so that the oblong receptacle 15 is provided in the bottom bracket 16). Due to the oblong shape of receptacle 15, the top pin 17 and receptacle 15 are ineffective as a ground path for the discharge of static electricity from the circuit board 10.

SUMMARY OF THE INVENTION

The present invention relates to a system for dissipating static electric charge from electronics on a circuit board as the board is inserted into an enclosure. The enclosure includes one or two conductive gaskets mounted on a flange affixed across a front side of the enclosure and having a path to ground through the enclosure. The gaskets are mounted so as to receive a ground pin extending from the circuit board as the circuit board is inserted into the enclosure. The pin has a length so that the pin contacts the dissipative gaskets prior to any electrical connection of the contacts on the circuit board and pins on the backplane.

The use of gaskets in accordance with the present invention provides greater tolerances and greater surface area of contact (thus reducing impedance and heat generation) between the pin and conductive gasket as compared to prior art systems.

BRIEF DESCRIPTION OF THE DRAWINGS

The present invention will now be described with reference to the drawings in which.

DETAILED DESCRIPTION

Embodiments of the present invention will now be described with reference to FIGS. 1–5, which relate to a system for dissipating static electric charge from electronics on a circuit board as the board is inserted into an enclosure. While the enclosure may be used in technologies such as telecommunications, industrial control, medical electronics, and military applications, it is understood that the present invention is not limited to enclosures for such technologies, and may be used in enclosures intended for a variety of other technologies and applications.

Moreover, it is understood that the present invention may be embodied in many different forms and should not be construed as being limited to the embodiments set forth herein. Rather these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
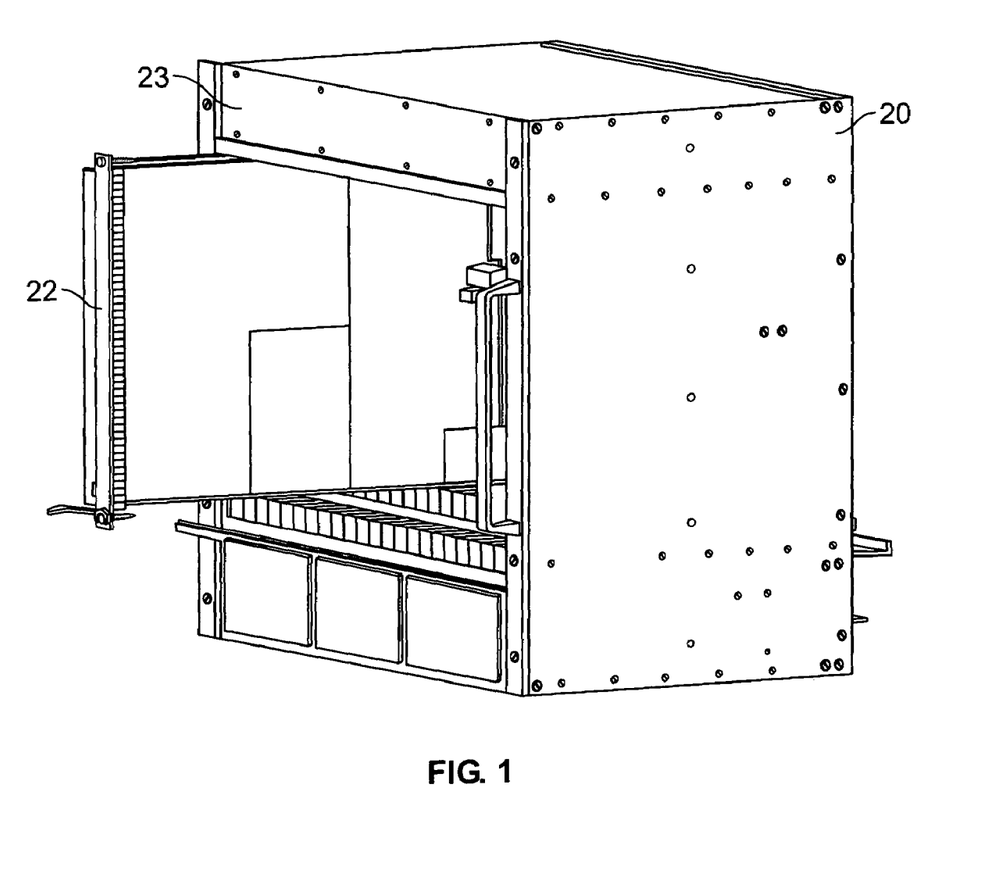
FIG. 1 is a perspective view of an enclosure including ESD dissipative gaskets according to the present invention for dissipating charge from circuit boards housed within the enclosure.

Referring now to FIG. 1, there is shown an enclosure 20 for housing a plurality of circuit boards 22 in parallel relation to each other (one such circuit board 22 being shown in FIG. 1). At least portions of the enclosure 20 are electrically conductive, typically made of metal or conductive plastic, such as conductive ABS, providing a path to ground. The circuit boards 22 are inserted through a front surface 23 of the enclosure 20. A rear surface (not shown) of each circuit board 22 has connectors (not shown) for engagement with pins protruding from a backplane (not shown) on a rear surface of the enclosure 20.

Figure 2:
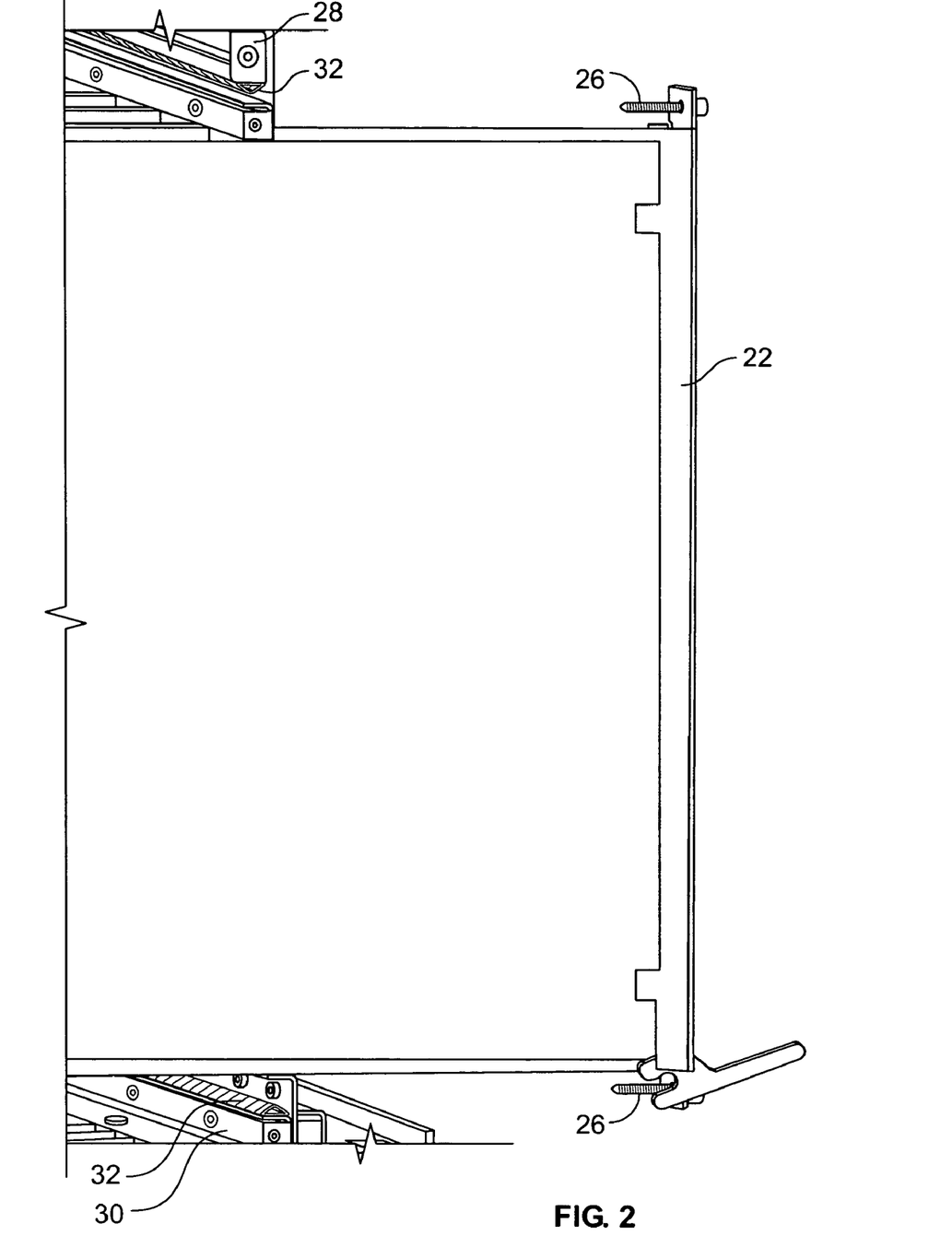
FIG. 2 is a perspective view within the interior of the enclosure showing a circuit board being inserted into the enclosure.
Figure 3:
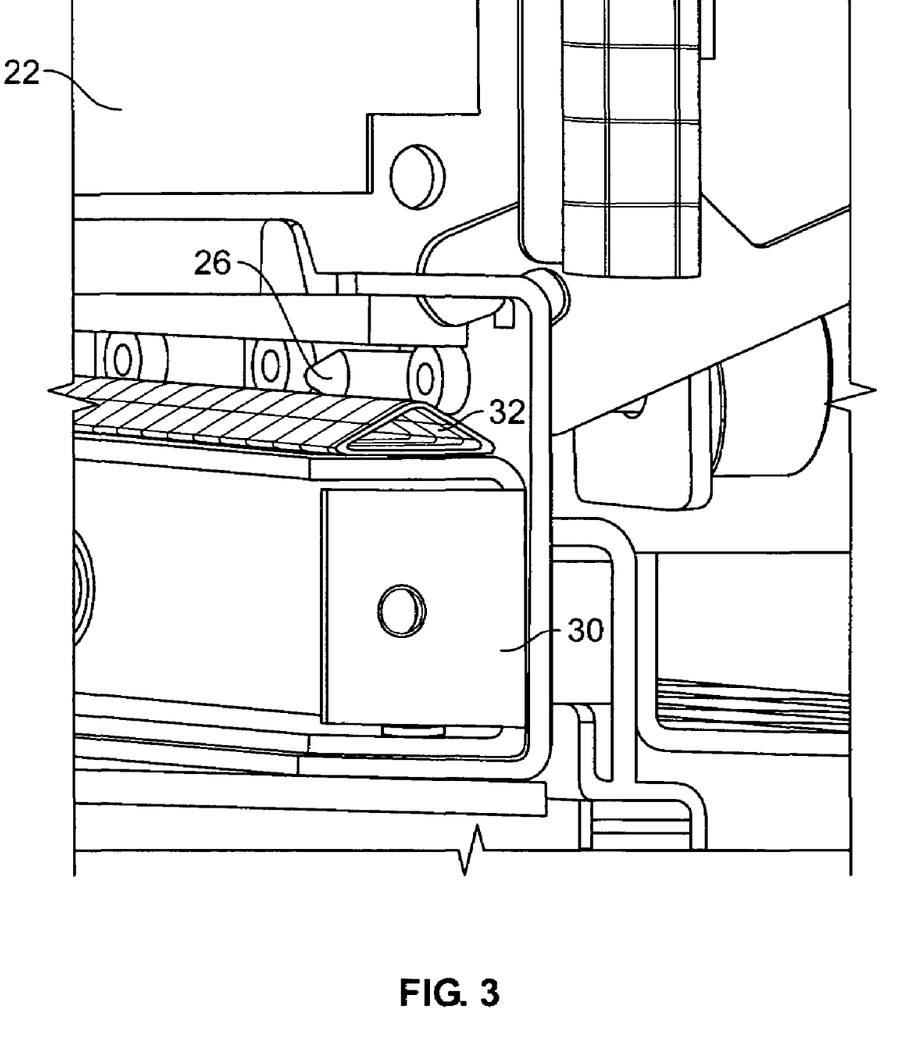
FIG. 3 is an enlarged perspective view of an enclosure according to the present invention showing a ground pin being inserted into engagement with a single gasket for dissipating charge from circuit boards housed within the enclosure.
Figure 4:
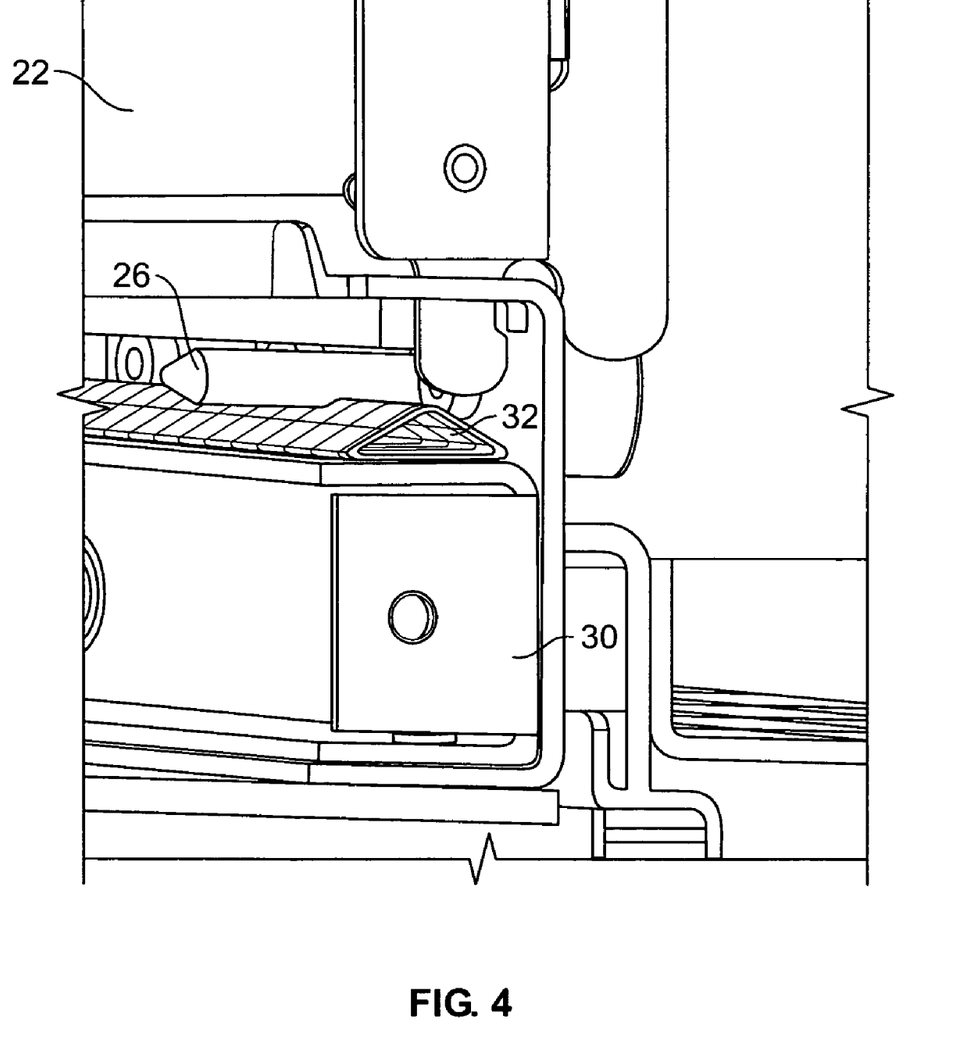
FIG. 4 is an enlarged perspective view of an enclosure according to the present invention showing a ground pin fully inserted into engagement with a single gasket for dissipating charge from circuit boards housed within the enclosure.
Figure 5:
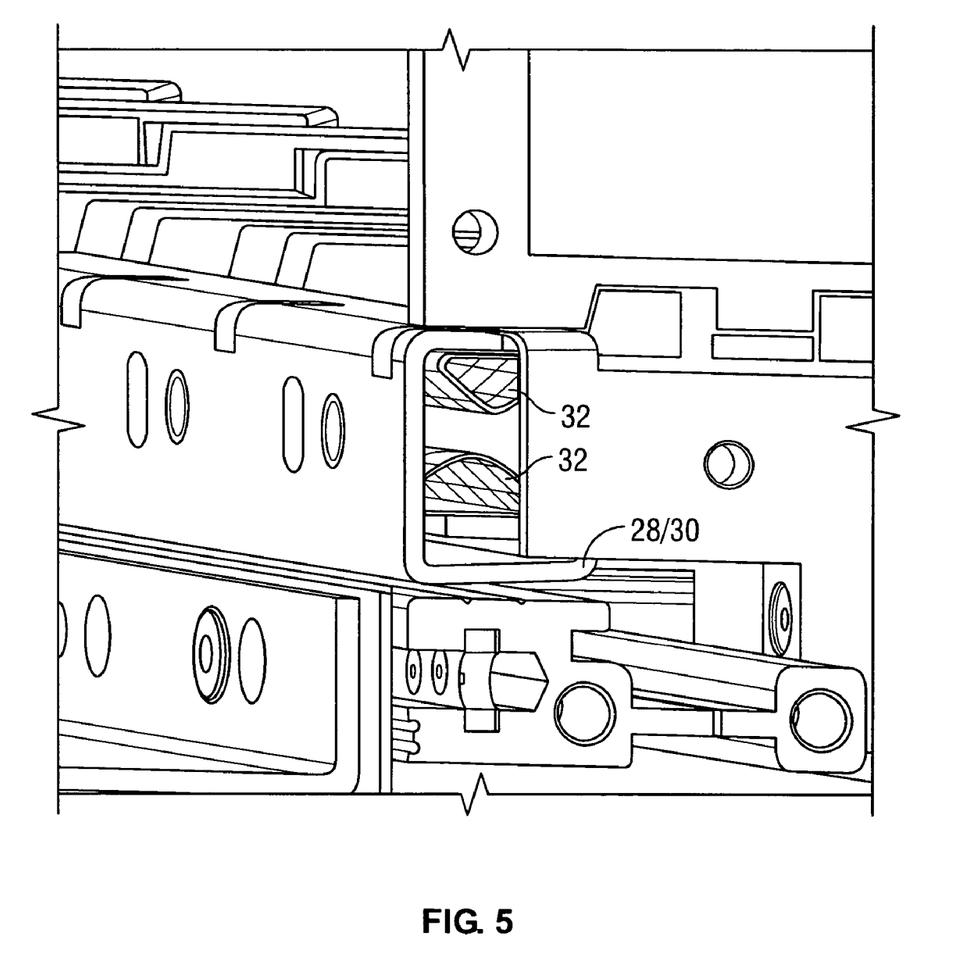
FIG. 5 is an enlarged perspective view of an enclosure according to an alternative embodiment of the present invention including a pair of opposed gaskets for dissipating charge from circuit boards housed within the enclosure.

Referring to FIGS. 2 through 4, circuit boards 22 typically include ground pins 26 for grounding the circuit boards 22. The enclosure 20 includes a top flange 28 and a bottom flange 30 adjacent to the front surface 23, across a top and bottom portion of the front surface 23. In accordance with a first embodiment of the present invention, a conductive, elastic gasket 32 is affixed to each of the top and bottom flanges 28, 30. As shown in FIGS. 2 and 3, as the circuit boards are inserted into the front surface 23 of enclosure 20, the ground pin 26 at the top of the circuit board engages the gasket 32 mounted on the top flange 28, and the ground pin 26 at the bottom of the circuit board engages the gasket 32 mounted on the bottom flange 30 (FIGS. 3 and 4 show only the engagement of the pin 26 with the gasket 32 on the bottom flange 30). It is understood that the gasket 32 on either the top flange 28 or bottom flange 30 may be omitted in alternative embodiments so that the enclosure 20 includes only a single gasket that is engaged by the ground pin 26 at either the top or bottom of the circuit board.

Each of the gaskets 32 is preferably of known construction, such as for example any of various gaskets manufactured by Laird Technologies, P.O. Box 650, Shielding Way, Delaware Water Gap, Pa. 18327. They may be formed of a flexible, spring-like material which is conductive, or is coated with a conductive material, for example, beryllium copper, stainless steel or nylon with metallic threads. The spring-like material is elastic in that it deforms upon engagement with a ground pin, but then returns to its original shape when the engagement with the ground pin ends. The gaskets may be affixed to the flanges 28 and/or 30 by conventional means such as a conductive or non-conductive adhesive, screws or rivets. Alternatively, they may be formed so as to clip onto flanges 28 and/or 30. In a preferred embodiment, the gaskets 32 on the upper flange 28 and/or lower flange 30 preferably have a length across the front surface 23 of the enclosure 20 sufficient so that the ground pins 26 on each of the circuit boards inserted into the enclosure 20 engage the gasket 32 on the upper flange 28 and/or lower flange 30.

The gaskets 32 include a surface for engaging the ground pin 26 which is convex and which is deformed by the ground pin upon engagement therewith when the circuit board 22 is inserted into the enclosure 20. While gaskets 32 may be used in preferred embodiments, it is understood that other conductive and deformable materials may be affixed to flanges 28 and/or 30 to provide a tolerant ESD engagement with ground pins 26 upon insertion of the circuit boards 22 into enclosure 20. Such alternatives include a metallic mesh or a deformable polymer or rubber which is conductive or is coated with an electrically conductive material and mounted to flanges 28 and/or 30. Other known alternatives are contemplated.

In operation, upon insertion of a circuit board 22 into enclosure 20, prior to engagement between the circuit board contacts and the backplane pins, the ground pins 26 engage the gasket 32 mounted on the top flange 28 and/or on the bottom flange 30. Any charge on the circuit board dissipates through ground pins 26 to gasket(s) 32, and from gasket(s) 32 to the flanges 28/30. The flanges are in turn grounded through the enclosure.

The gasket(s) 32 provide a tolerant solution to dissipating charge from the circuit board 22 through the ground pins 26. Unlike the prior art receptacles, precise alignment between the gasket and ground pin is not required. For example, where the vertical alignment of the ground pin 26 is higher than expected relative to the enclosure, the ground pin still engages the gasket, but does not deform or compress it significantly. Alternatively, where the vertical alignment of the ground pin 26 is lower than expected relative to the enclosure, the ground pin engages the gasket and significantly deforms or compresses it. In this way, the vertical alignment of the ground pin may vary $1/16$ inch to $1/8$ inch above or below the expected vertical position within the enclosure and still establish a good electrical connection with the gasket for discharging static buildup. It is unlikely that the misalignment between the ground pin and enclosure would be greater than $1/8$ inch. However, it is understood that in applications where larger misalignments may occur, gaskets according to the present invention may be provided in which the vertical alignment of the ground pin may vary greater than $1/8$ inch, for example $1/4$ inch, above or below the expected vertical position within the enclosure and still establish a good electrical connection with the gasket for discharging static buildup.

Moreover, the deformation of the gasket upon contact by the ground pin allows a large area of contact between the gasket and ground pin. The large area of contact between the gasket and ground pin allows efficient dissipation of charge from the circuit boards without generating excessive heat at the interface. In one embodiment, each gasket is able to dissipate 25 amps from each circuit board through the ground pin. It is understood that the gaskets may be capable of dissipating more or less charge than that in alternative embodiments. Further still, gaskets 32 may be purchased off the shelf, and a single gasket may be used to dissipate charge from the entire set of circuit boards inserted into enclosure 20.

Up to this point, the ground pins 26 at the top and bottom of the circuit board 22 engage a single gasket 32. However, in an alternative embodiment shown in FIG. 5, the ground pins 26 (not shown in FIG. 5) may engage a first gasket 32 mounted on a bottom portion of flange 28 and/or 30, and a second gasket 32 mounted on a top portion of flange 28 and/or 30. Thus, upon insertion of the circuit board 22, the ground pin 26 engages and deforms both gaskets 32 on the bottom and top portions of the flanges 28 and/or 30.

It is understood that the gasket 32 described in each of the embodiments shown in FIGS. 1–5, and the use of gasket 32 in accordance with the present invention, complies with and allows compliance with all applicable standards, including the Advanced Telecom Computing Architecture (ATCA) PICMG 3.0 Short Form Specification, which specification is incorporated by reference herein in its entirety.

As indicated in the Background of the Invention section, conventional enclosures included a second receptacle for receiving an alignment pin also provided on the circuit board. However, owing to the difficulty in aligning both the top and bottom pins within respective top and bottom receptacles, the top receptacle is typically oblong in shape. Thus, the top pin and receptacle are ineffective in conventional designs as a ground path for the discharge of static electricity from the circuit board. However, in accordance with a further aspect of the present invention, the gasket(s) 32 remove the requirement for accurate alignment of the pins and receptacles and allow the upper pin to also engage one or two gaskets mounted adjacent the lower bracket, thus establishing a redundant ground path to the ground path provided by the upper ground pin and gasket(s) as explained above. The redundant ground path ensures that static is discharged from the circuit board in the event of a defect in the ground path established by the lower ground pin and gasket(s). Additionally, the redundant ground path established by the upper ground pin and gasket(s) provides even more surface area over which charge may be dissipated from the circuit board. It is understood that either the top or bottom pin on the circuit board may be considered to establish the redundant ground path.

Although the invention has been described in detail herein, it should be understood that the invention is not limited to the embodiments herein disclosed. Various changes, substitutions and modifications may be made to the disclosure by those skilled in the art without departing from the spirit or scope of the invention.

What is claimed is:

1. An electrostatic discharge system in an enclosure for housing a circuit board capable of electrically connecting to a backplane in the enclosure, the circuit board including at least one ground pin extending from the circuit board, the electrostatic discharge system comprising:

a gasket, mounted within the enclosure, the ground pin capable of engaging and deforming the gasket upon insertion of the circuit board into the enclosure and prior to electrical connection of the circuit board with the backplane, the gasket capable of conducting an electric charge; and a ground path from the gasket to ground.

2. An electrostatic discharge system in an enclosure as recited in claim 1, the gasket mounted on a flange within the enclosure at a height so that the ground pin partially compresses the gasket upon insertion of the printed circuit board into the enclosure.

3. An electrostatic discharge system in an enclosure as recited in claim 2, the gasket mounted to the flange with an adhesive.

4. An electrostatic discharge system in an enclosure as recited in claim 3, wherein the adhesive is electrically conductive.

5. An electrostatic discharge system in an enclosure as recited in claim 2, the gasket mounted to the flange by screws.

6. An electrostatic discharge system in an enclosure as recited in claim 2, the gasket mounted to the flange by rivets.

7. An electrostatic discharge system in an enclosure as recited in claim 1, the gasket formed of a spring-like material capable of partially deforming upon contact with the ground pin.

8. An electrostatic discharge system in an enclosure as recited in claim 1, the gasket formed of an electrically conductive material.

9. An electrostatic discharge system in an enclosure as recited in claim 1, the gasket coated with an electrically conductive material.

10. An electrostatic discharge system in an enclosure as recited in claim 9, wherein the electrically conductive material is at least one of beryllium copper, stainless steel or nylon with metallic threads.

11. An electrostatic discharge system in an enclosure for housing a circuit board capable of electrically connecting to a backplane in the enclosure, the circuit board including at least one ground pin extending from the circuit board, the electrostatic discharge system comprising:
  an elastic, electrically conductive material mounted within the enclosure in a position so as to be engaged by the ground pin upon insertion of the circuit board into the enclosure and prior to electrical connection of the circuit board with the backplane; and
  a ground path from the elastic, electrically conductive material to ground through the enclosure.

12. An electrostatic discharge system in an enclosure as recited in claim 11, the elastic, electrically conductive material comprising a gasket mounted within the enclosure.

13. An electrostatic discharge system in an enclosure as recited in claim 11, the elastic, electrically conductive material comprising a wire mesh.

14. An electrostatic discharge system in an enclosure as recited in claim 11, the elastic, electrically conductive material comprising a polymer having an electrically conductive coating.

15. An electrostatic discharge system in an enclosure for housing a plurality of circuit boards capable of electrically connecting to a backplane in the enclosure, the circuit boards being inserted into the housing and each circuit board of the plurality of circuit boards including at least one ground pin extending from the circuit board, the electrostatic discharge system comprising:
  a strip of elastic, deformable and electrically conductive material mounted within the enclosure in a position so as to be engaged by the ground pin on each circuit board upon insertion of each circuit board into the enclosure and prior to electrical connection of the circuit board being inserted with the backplane; and
  a ground path from the elastic, electrically conductive material to ground through the enclosure.

16. An electrostatic discharge system in an enclosure as recited in claim 15, the strip of elastic, deformable and electrically conductive material comprising a gasket mounted on a flange within the enclosure at a height so that the ground pin partially compresses the gasket upon insertion of each printed circuit board into the enclosure.

17. An electrostatic discharge system in an enclosure as recited in claim 16, the gasket mounted to the flange with an adhesive.

18. An electrostatic discharge system in an enclosure as recited in claim 15, the strip of elastic, deformable and electrically conductive material having an area of contact with the ground pin upon engagement of the ground pin with the strip of elastic, deformable and electrically conductive material capable of dissipating at least 25 amperes of electrical current away from each printed circuit board.

19. An electrostatic discharge system in an enclosure as recited in claim 15, the strip of elastic, deformable and electrically conductive material comprising a first strip of elastic, deformable and electrically conductive material, the first strip of elastic, deformable and electrically conductive material being mounted below a path, and extending upward into the path, of a ground pin on each printed circuit board as each printed circuit board is inserted into the enclosure,
  the electrostatic discharge system further comprising a second strip of elastic, deformable and electrically conductive material, the second strip of elastic, deformable and electrically conductive material being mounted spaced from and juxtaposed to the first strip of elastic, deformable and electrically conductive material and above the path, and extending downward into the path, of a ground pin on each printed circuit board as each printed circuit board is inserted into the enclosure.

20. An electrostatic discharge system in an enclosure for housing a plurality of circuit boards capable of electrically connecting to a backplane in the enclosure, the circuit boards being inserted into the housing and each circuit board of the plurality of circuit boards including a first pin extending from the circuit board adjacent a first edge of the circuit board and including a second pin extending from the circuit board adjacent a second edge of the circuit board, the second edge opposite the first edge, the electrostatic discharge system comprising:
  at least a first strip of elastic, deformable and electrically conductive material mounted within the enclosure in a position so as to be engaged by the first pin on each circuit board upon insertion of each circuit board into the enclosure and prior to electrical connection of the circuit board being inserted with the backplane, the at least first strip of elastic, deformable and electrically conductive material establishing a primary ground path for dissipating static charge from the circuit board;
  at least a second strip of elastic, deformable and electrically conductive material mounted within the enclosure in a position so as to be engaged by the second pin on each circuit board upon insertion of each circuit board into the enclosure and prior to electrical connection of the circuit board being inserted with the backplane, the at least second strip of elastic, deformable and electrically conductive material establishing a redundant ground path for dissipating static charge from the circuit board; and
  a ground path from the first and second elastic, electrically conductive materials to ground through the enclosure.

21. An electrostatic discharge system in an enclosure as recited in claim 20, the at least first and second strips of elastic, deformable and electrically conductive material comprising gaskets.

22. An electrostatic discharge system in an enclosure as recited in claim 20, the at least first strip of elastic, deformable and electrically conductive material comprising a first strip of elastic, deformable and electrically conductive material and a third strip of elastic, deformable and electrically conductive material, the first and third strips of elastic, deformable and electrically conductive material each being engaged by the first pin upon insertion of the circuit board into the enclosure.

23. An electrostatic discharge system in an enclosure as recited in claim 22, the at least second strip of elastic, deformable and electrically conductive material comprising a second strip of elastic, deformable and electrically conductive material and a fourth strip of elastic, deformable and electrically conductive material, the second and fourth strips of elastic, deformable and electrically conductive material each being engaged by the second pin upon insertion of the circuit board into the enclosure.

24. A tolerant electrostatic discharge system in an enclosure for housing a circuit board capable of electrically connecting to a backplane in the enclosure, the circuit board including at least one ground pin extending from the circuit board, the electrostatic discharge system comprising:
   a gasket, mounted within the enclosure, the ground pin capable of engaging and deforming the gasket upon insertion of the circuit board into the enclosure and prior to electrical connection of the circuit board with the backplane, the gasket capable of conducting an electric charge; and
   a ground path from the gasket to ground;
   the gasket establishing effective electrostatic dissipation from the circuit board even where the alignment between the at least one ground pin and the enclosure deviates from an expected alignment of the at least one ground pin and the enclosure.

25. An electrostatic discharge system in an enclosure as recited in claim 24, the gasket mounted to the flange with an adhesive.

26. An electrostatic discharge system in an enclosure as recited in claim 25, wherein the adhesive is electrically conductive.

27. An electrostatic discharge system in an enclosure as recited in claim 24, the gasket formed of a spring-like material capable of partially deforming upon contact with the ground pin.

28. An electrostatic discharge system in an enclosure as recited in claim 24, the gasket formed of an electrically conductive material.

29. An electrostatic discharge system in an enclosure as recited in claim 24, the gasket coated with an electrically conductive material.

30. An electrostatic discharge system in an enclosure as recited in claim 24, the gasket establishing effective electrostatic dissipation from the circuit board even where the alignment between the at least one ground pin and the enclosure deviates from an expected alignment of the at least one ground pin and the enclosure by as much as 1/8 inch.

31. An electrostatic discharge system in an enclosure as recited in claim 24, the gasket establishing effective electrostatic dissipation from the circuit board even where the alignment between the at least one ground pin and the enclosure deviates from an expected alignment of the at least one ground pin and the enclosure by as much as 1/4 inch.

32. A tolerant electrostatic discharge system in an enclosure for housing a circuit board capable of electrically connecting to a backplane in the enclosure, the circuit board including at least one ground pin extending from the circuit board, the electrostatic discharge system comprising:
   a gasket, mounted within the enclosure, the ground pin capable of engaging and deforming the gasket upon insertion of the circuit board into the enclosure and prior to electrical connection of the circuit board with the backplane, the gasket capable of dissipating an electric charge from the printed circuit board where the vertical alignment of the printed circuit board with the enclosure is above, at or below the expected vertical alignment of the printed circuit board with the enclosure; and
   a ground path from the gasket to ground.

33. An electrostatic discharge system in an enclosure as recited in claim 32, the gasket mounted to the flange with an adhesive.

34. An electrostatic discharge system in an enclosure as recited in claim 33, wherein the adhesive is electrically conductive.

35. An electrostatic discharge system in an enclosure as recited in claim 32, the gasket formed of a spring-like material capable of partially deforming upon contact with the ground pin.

36. An electrostatic discharge system in an enclosure as recited in claim 32, the gasket formed of an electrically conductive material.

37. An electrostatic discharge system in an enclosure as recited in claim 32, the gasket coated with an electrically conductive material.

38. An electrostatic discharge system in an enclosure as recited in claim 32, the gasket capable of dissipating an electric charge from the printed circuit board where the vertical alignment of the printed circuit board with the enclosure is above or below the expected vertical alignment of the printed circuit board with the enclosure by as much as 1/8 inch.

39. An electrostatic discharge system in an enclosure as recited in claim 32, the gasket capable of dissipating an electric charge from the printed circuit board where the vertical alignment of the printed circuit board with the enclosure is above or below the expected vertical alignment of the printed circuit board with the enclosure by as much as 1/4 inch.

* * * * *